(12) United States Patent
Nix et al.

(10) Patent No.: US 7,852,161 B2
(45) Date of Patent: Dec. 14, 2010

(54) COMPLEMENTARY RING OSCILLATOR WITH CAPACITIVE COUPLING

(75) Inventors: Michael A. Nix, Austin, TX (US); Saeed Abbasi, Narberth, PA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 36 days.

(21) Appl. No.: 12/353,619

(22) Filed: Jan. 14, 2009

(65) Prior Publication Data
US 2010/0176889 A1    Jul. 15, 2010

(51) Int. Cl.
*H03B 5/24* (2006.01)
(52) U.S. Cl. ............................ 331/57; 331/2; 331/46
(58) Field of Classification Search ............... 331/2, 331/46, 57
See application file for complete search history.

(56) References Cited

U.S. PATENT DOCUMENTS

| | | | |
|---|---|---|---|
| 5,864,258 A | * | 1/1999 | Cusinato et al. ............... 331/34 |
| 6,333,680 B1 | * | 12/2001 | Smith et al. ................... 331/57 |
| 6,943,633 B2 | | 9/2005 | Singh |
| 7,355,488 B2 | | 4/2008 | Park |
| 7,482,884 B2 | | 1/2009 | Wang et al. |

* cited by examiner

*Primary Examiner*—Robert Pascal
*Assistant Examiner*—James E Goodley
(74) *Attorney, Agent, or Firm*—Meyertons, Hood, Kivlin, Kowert & Goetzel, P.C.; Erik A. Heter

(57) ABSTRACT

An oscillator. The oscillator includes a first ring oscillator having a first plurality of inverters, a first plurality of capacitors each having a first terminal coupled to an output terminal of a corresponding one of the first plurality of inverters, a second ring oscillator having a second plurality of inverters, and a second plurality of capacitors each having a first terminal coupled to an output terminal of a corresponding one of the second plurality of inverters. A second terminal of the first plurality of capacitors is coupled to an output terminal of a corresponding one of the second plurality of inverters. A second terminal of the second plurality of capacitors is coupled to an output terminal of a corresponding one of the first plurality of inverters. The oscillator is configured to provide as an output a differential clock signal.

20 Claims, 4 Drawing Sheets

COMPLEMENTARY RING OSCILLATOR WITH CAPACITIVE COUPLING

BACKGROUND OF THE INVENTION

1. Field of the Invention

This invention relates to electronic circuits, and more particularly, to ring oscillators.

2. Description of the Related Art

Ring oscillator circuits are well known in the art of electronics. Common ring oscillators may be constructed of an odd number of inverters coupled in a chain, with the output of a last inverter in the chain fed back to the input of a first inverter. Such a configuration results in a circuit that, when a sufficient voltage is applied, oscillates spontaneously between two logic voltage levels (i.e. a high level and a low level).

Ring oscillators have a variety of applications, such as clock signal generation and temperature sensing. Complementary ring oscillators, a variation of the traditional ring oscillator, may be used in applications where complementary outputs are desired.

The particular frequency at which such a circuit oscillates is determined by various factors, such as the transistors used to implement the various elements. Due to the demands of higher clock speeds and smaller feature sizes, implementation of ring oscillators has become more difficult. In particular, at higher frequencies and smaller feature sizes, degradation mechanisms such as noise susceptibility and jitter become problematic. In addition, complementary ring oscillators designed on differential amplifier circuits may have a relatively large footprint and may consume more power than their single ended counterparts, while producing output signals that are not full-swing (and thus require additional buffers). Therefore, designing complementary ring oscillators having a high frequency output that is full swing with good noise immunity and low jitter provides a difficult challenge.

SUMMARY OF THE INVENTION

An oscillator is disclosed. In one embodiment, the oscillator includes a first ring oscillator having a first plurality of inverters, and a first plurality of capacitors, wherein a first terminal of each of the first plurality of capacitors is coupled to an output terminal of a corresponding one of the first plurality of inverters. The oscillator further includes a second ring oscillator having a second plurality of inverters and a second plurality of capacitors, wherein a first terminal of each of the second plurality of capacitors is coupled to an output terminal of a corresponding one of the second plurality of inverters. A second terminal of each of the first plurality of capacitors is coupled to an output terminal of a corresponding one of the second plurality of inverters. A second terminal of each of the second plurality of capacitors is coupled to an output terminal of a corresponding one of the first plurality of inverters. The oscillator is configured to provide as an output a differential clock signal.

In another embodiment, the oscillator includes a first ring oscillator having a first plurality of inverters and a second ring oscillator having a second plurality of inverters. Each inverter of the first and second plurality includes a normal output terminal and a capacitive output terminal. A capacitive output terminal of each of the first plurality of inverters is coupled to a unique one of the inputs of the second plurality of inverters with respect to the capacitive output terminals of the other ones of the first plurality of inverters. A capacitive output terminal of each of the second plurality of inverters is coupled to a unique one of the inputs of the first plurality of inverters with respect to the capacitive output terminals of the other ones of the second plurality of inverters.

In one embodiment, each of the inverters of an oscillator circuit are dual-output inverters. The dual output inverters include an input, a normal output, and a capacitive output. The capacitive output may be implemented by coupling a capacitive circuit between a node of the normal output and the capacitive output. In one embodiment, the capacitive circuit may be implemented using one or more capacitively coupled transistors, e.g., a capacitively coupled PMOS and a capacitively coupled NMOS.

Each of the first and second pluralities of inverters may comprise separate ring oscillators. Accordingly, in one embodiment, the inverters of the first plurality are coupled in series with each other, as are the inverters of the second plurality. An output of a last inverter of the first plurality is coupled to an input of a first inverter of the first plurality to close the ring, while similarly, an output of a last inverter of the second plurality if coupled to an input of a first inverter of the second plurality.

In one embodiment, the capacitive output of each dual-output inverter of one plurality is coupled to an input terminal of the other plurality. For example, the capacitive output of a first inverter of the first plurality may be coupled to an input of a third one of the second plurality. Alternatively, it can be stated as being coupled to the output of the second inverter of the second plurality, since each of the first and second pluralities of inverters are coupled in series to form first and second ring oscillators, respectively, in this embodiment.

Thus, in various embodiments, the oscillator circuit can be viewed as two separate ring oscillator circuits that are capacitively coupled to each other. The oscillator circuit in such an embodiment is configured to provide as an output a differential clock signal having a true clock output and a complementary clock output.

BRIEF DESCRIPTION OF THE DRAWINGS

Other aspects of the invention will become apparent upon reading the following detailed description and upon reference to the accompanying drawings in which.

Figure 1A:
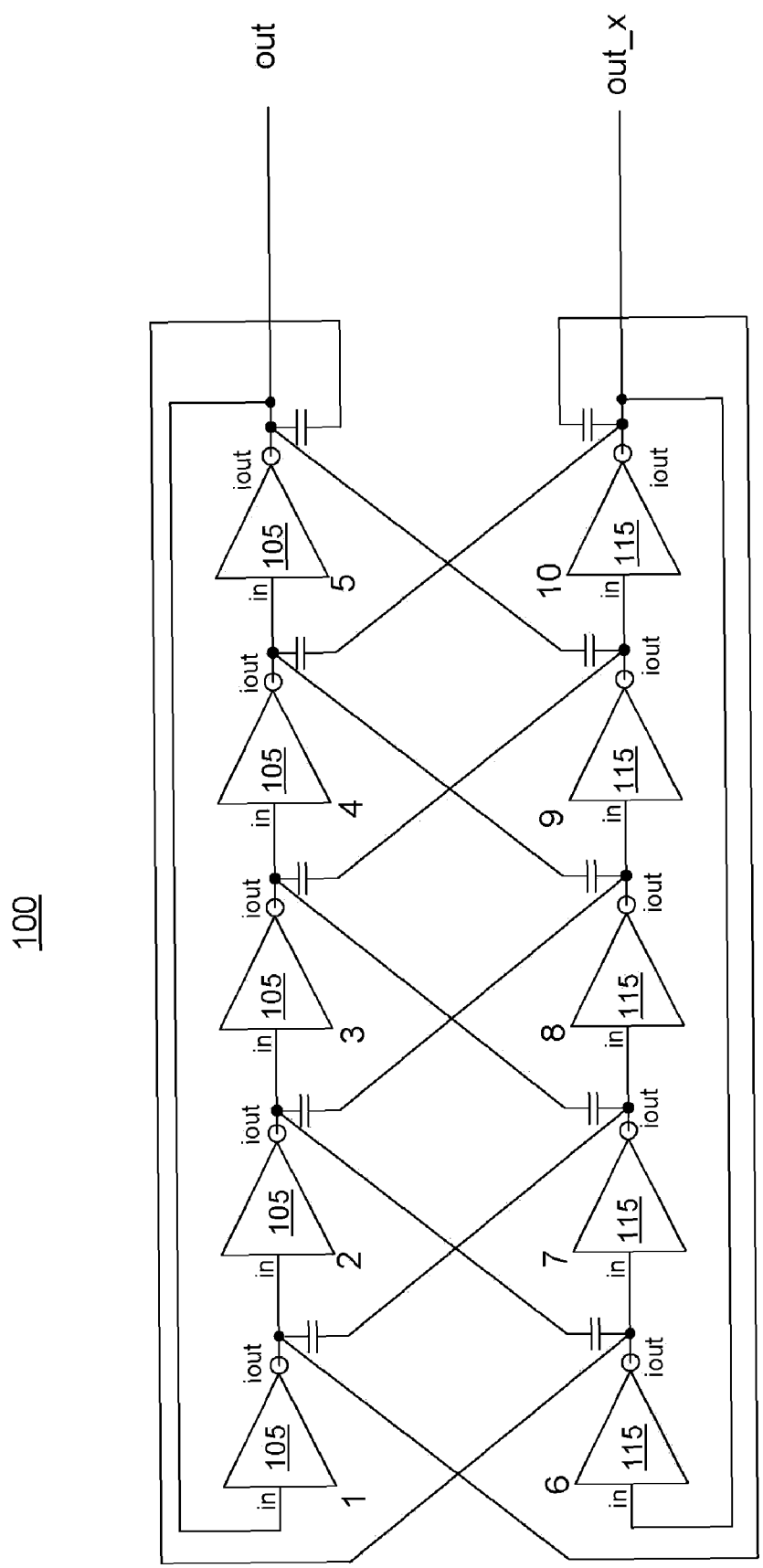
FIG. 1A is a schematic diagram illustrating one embodiment of an oscillator circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION OF THE INVENTION

FIG. 1A is a schematic diagram illustrating one embodiment of an oscillator circuit. In the embodiment shown, oscillator 100 includes a first plurality of inverters 105 and a second plurality of inverters 115. The inverters 105 of the first plurality are coupled to form a first ring oscillator, while inverters 115 of the second plurality are coupled to form a second ring oscillator. In other words, each of the first and second pluralities of inverters includes an odd number of inverters coupled in a series configuration, with an output of the last inverter of a given plurality coupled to an input of the first inverter of the same plurality. The first ring oscillator comprising inverters 105 is configured to provide an output clock ('out'), while the second ring oscillator comprising inverters 115 is configured to provide a complementary output clock ('out_x'). Accordingly, the embodiment shown is a differential oscillator configured to provide a differential clock signal having true and complementary components.

In the embodiment shown, first and second pluralities of capacitors are present, which provide capacitive coupling between the first and second ring oscillators. The capacitive coupling may be used to implement the desired phase relationship between the output clock signals. Each of the first plurality of capacitors has a first terminal coupled to an output terminal of a corresponding one of the first plurality of inverters 105. Similarly, each of the second plurality of capacitors has a second terminal coupled to an output terminal of a corresponding one of the second plurality of inverters. Furthermore, a second terminal of each of the first plurality of capacitors is coupled to a an output terminal of one of the second plurality of inverters, while a second terminal of each of the second plurality of capacitors is coupled to an output terminal of one of the first plurality of inverters. For example, in the embodiment shown, a capacitor is coupled between the output of inverter 1 (in the first plurality) and the output of inverter 7 (in the second plurality). In another example, a capacitor is coupled between the output of inverter 6 (of the second plurality) and the output of inverter 2 (of the first plurality). Thus, in this particular embodiment, capacitive coupling between two different ring oscillators is provided between one stage of one of the ring oscillators and a successive state of the other ring oscillator. Furthermore, the capacitive coupling is provided in the embodiment shown such that each capacitor is coupled between a unique pair of terminals with respect to each of the other capacitors of the first and second pluralities. Accordingly, no two unique pair of terminals has more than one capacitor coupled therebetween in the embodiment shown.

It should be noted that the circuit arrangement to provide capacitive coupling in the embodiment shown in FIG. 1A is but one possibility, while other arrangements are also possible and contemplated. The particular arrangement of capacitors for capacitively coupling the two separate ring oscillators may be determined by, among other things, the specific design requirements for the application in which the oscillator circuit is to be used.

Figure 1B:
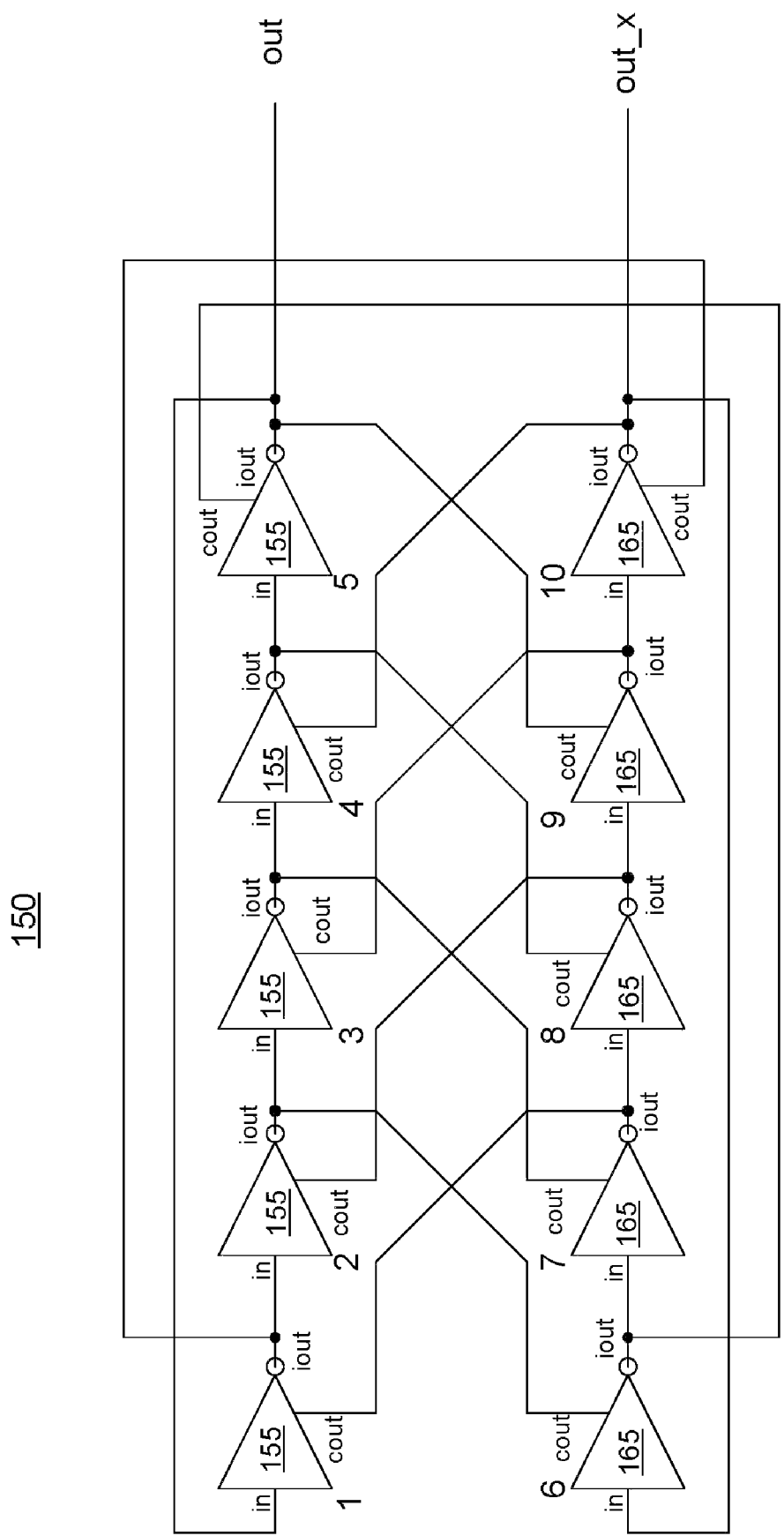
FIG. 1B is a schematic diagram illustrating another embodiment of an oscillator circuit.

Turning now to FIG. 1B, a schematic diagram illustrating another embodiment of an oscillator circuit is shown. The arrangement of oscillator 150 shown in FIG. 1B has some similarities to that shown in FIG. 1A. However, instead of implementing the capacitive coupling between the two ring oscillators using separate capacitors, the capacitors are integrated into the inverters in this particular embodiment.

In the embodiment shown, oscillator 150 is configured to produce a differential output clock signal using two ring oscillator circuits that are capacitively coupled to each others. Each of a first plurality of inverters 155 and a second plurality of inverters 165 are dual-output inverters. Each of these inverters includes a normal output, iout, and a capacitive output, cout. The capacitive output of each of the ring oscillators is coupled in a manner similar to the way the capacitors are coupled in the embodiment of FIG. 1A. For example, the capacitive output of inverter 1 of the first ring oscillator is coupled to the output of inverter 7 of the second ring oscillator, while the capacitive output of inverter 6 of the second ring oscillator is coupled to the output of inverter 2 of the first ring oscillator. The last inverter of the first ring oscillator, inverter 5, has its capacitive output coupled to the output of the first inverter of the second ring oscillator, inverter 6. Similarly, the last inverter of the second ring oscillator, inverter 10, has its capacitive output coupled to the output of the first inverter of the first ring oscillator, inverter 1.

As with the embodiment of FIG. 1A, the first and second ring oscillators are formed by coupling a plurality of inverters in series, with the normal output of a last inverter coupled to the input of a first inverter. Furthermore, the capacitive couplings are unique between inverter pairs. For example, while the capacitive output of inverter 1 of the first ring oscillator is coupled to the output of inverter 7 of the second ring oscillator, no other ring oscillator has a capacitive output that is also coupled to inverter 7. Thus, each inverter output of one of the ring oscillators is coupled to a unique one of the capacitive outputs of the inverters of the other ring oscillator.

Figure 2:
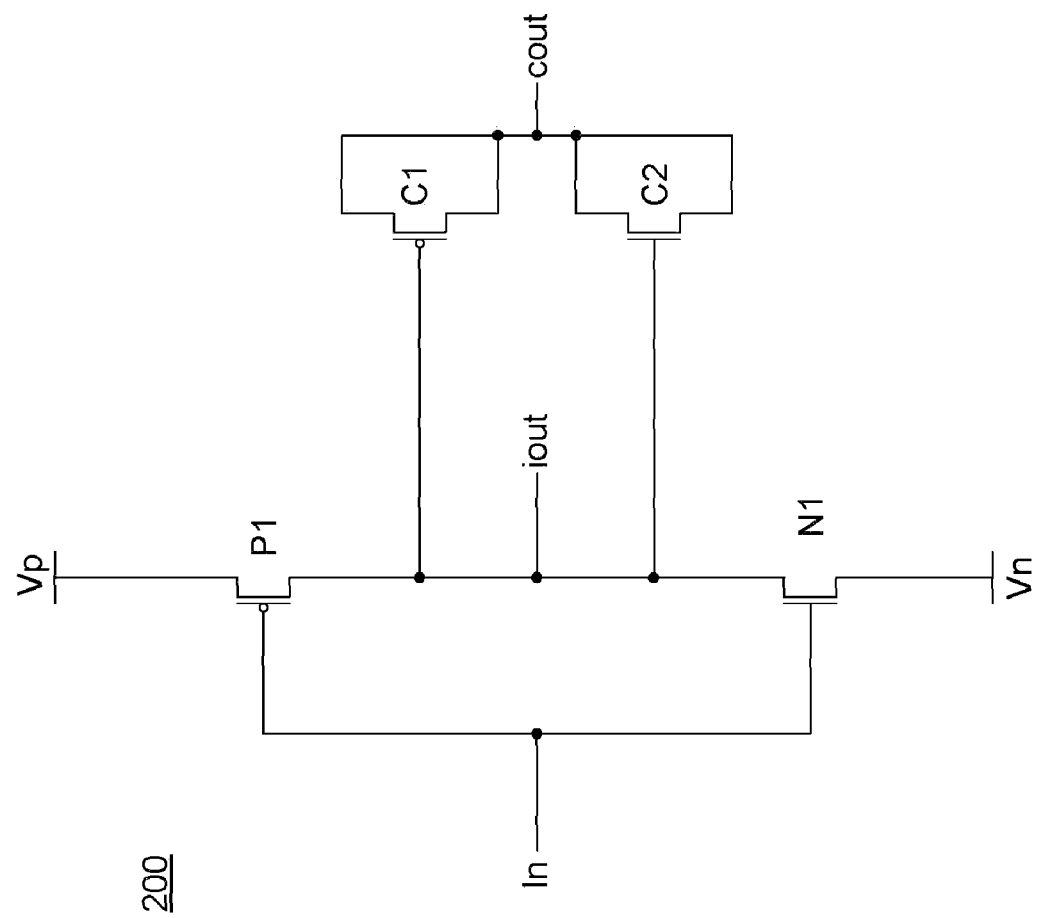
FIG. 2 is a schematic diagram of one embodiment of a circuit used to implement the inverters of the embodiment of the ring oscillator circuit of FIG. 1B.

FIG. 2 is a schematic diagram of one embodiment of a circuit used to implement the inverters of the embodiment of the ring oscillator circuit of FIG. 1B. In the embodiment shown, inverter 200 is a dual output inverter, including a first PMOS device P1 and a first NMOS device N1. An input terminal of inverter 200 is coupled to each of the gate terminal of transistors P1 and N1. A source terminal of transistor P1 is coupled to voltage Vp, while a source terminal of transistor N1 is coupled to voltage Vn. The drain terminals of both transistors P1 and N1 are coupled together to form a normal output node to which the output terminal iout is coupled.

A capacitive circuit is coupled between the normal output node iout and the capacitive output node cout. In this particular embodiment, the capacitive circuit is implemented using a pair of capacitively coupled transistors. Transistor C1 is a capacitively coupled PMOS transistor, while transistor C2 is a capacitively coupled NMOS transistor. The gate terminals of each of transistors C1 and C2 are coupled to the normal output node, iout, while the source and drain terminals of each of these transistors are coupled to the capacitive output node, cout. Thus, a pair of capacitors is implemented in this embodiment using transistors. Such an implementation may be useful in integrated circuits or wherever implementation of a traditional capacitor is not practical or desirable.

The implementation of a capacitive circuit in manner shown in FIG. 1B causes a phase difference between an output signal on the normal output node and an output signal on the capacitive output node when inverter 150 is operating in an embodiment of the ring oscillator circuit of FIG. 1B.

It should be noted that other embodiments using a single capacitor, a single capacitively coupled transistor, or other arrangements of capacitive circuity are also possible and contemplated. It is further contemplated that tunable capacitances may be used in some embodiments in order to provide the ability to fine tune the phase relationship between the normal output and the capacitive output of each of the dual output inverters 150.

Using various embodiments of the ring oscillator circuit discussed with reference to FIGS. 1A and 1B, differential clock signals can be produced having a high frequency with a full voltage swing between voltages Vp and Vn. Various embodiments of the ring oscillator circuit discussed herein may also operate with low jitter, and may consume less power and area than other circuits traditionally used to implement ring oscillators for the purpose of producing differential clock signals, such as circuits that provide direct coupling between two different ring oscillators, wherein the direct coupling is provided between corresponding ring oscillator nodes using traditional inverter circuits.

Figure 3:
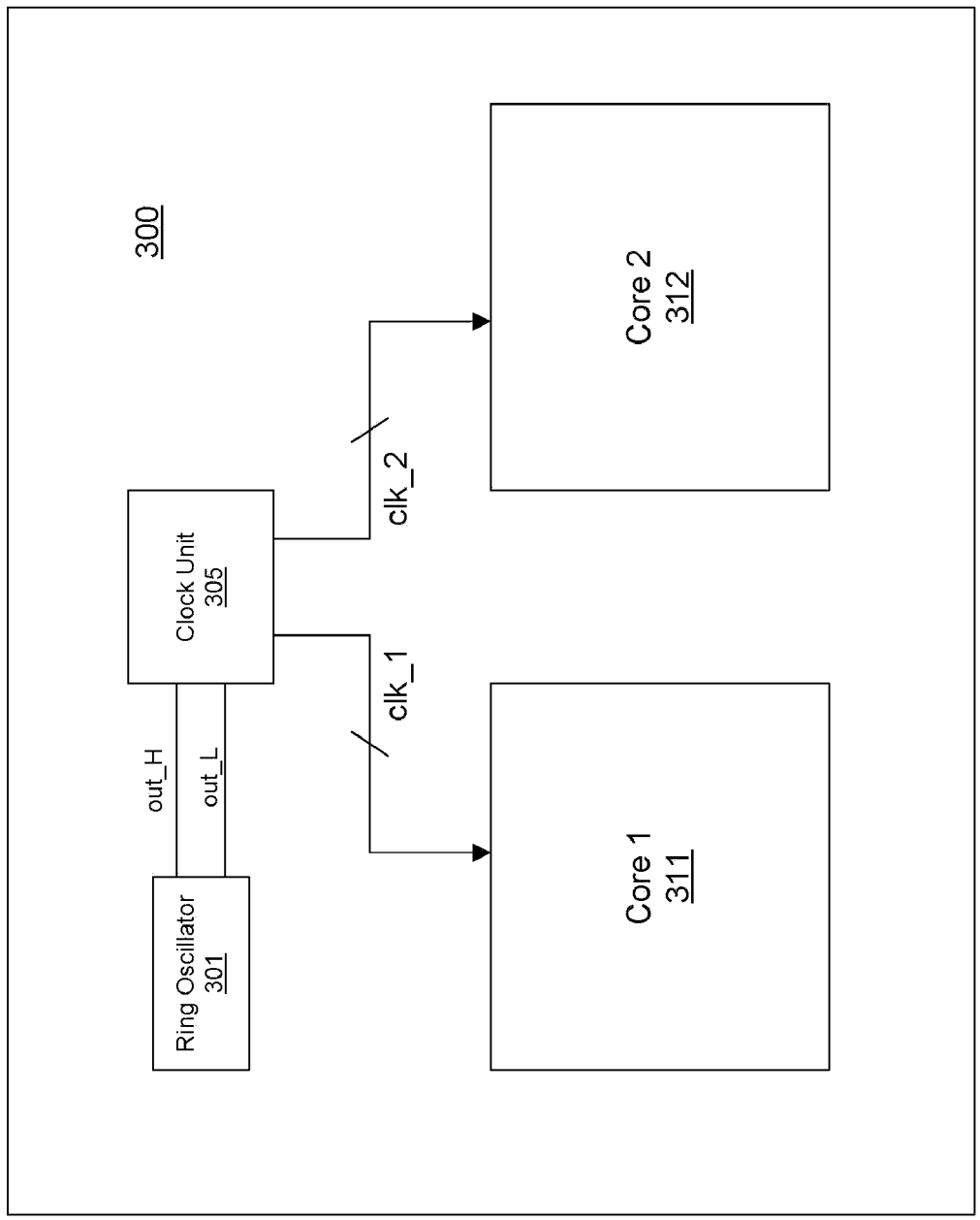
FIG. 3 is a block diagram of one embodiment an integrated circuit using a ring oscillator and a clock circuit in order to generate clock signals.

FIG. 3 is a block diagram of one embodiment an integrated circuit using a ring oscillator and a clock circuit in order to generate clock signals. In the embodiment shown, integrated circuit 300 is a dual core processor having a clock unit 305 and a ring oscillator 301. Ring oscillator 301 may be an embodiment of a ring oscillator such as those illustrated in FIGS. 1A and 1B. A differential reference clock signal is generated by ring oscillator 301 and provided to clock unit 305 in this embodiment. Clock unit 305 may included one or more clock generation circuits that operate using a reference clock signal. Such clock generation circuits may include phase locked loops (PLLs) or delay locked loops (DLLs). Clock unit 305 may be configured, in one embodiment, to provide differential clock signals to each of cores 311 and 312. In another embodiment, clock unit 305 may use the differential clock signal provided by ring oscillator 301 to generate one or more single-ended clock signals. Clock unit 305 may also multiply or divide the frequency of the differential reference clock signal provided by ring oscillator 301 in order to provide one or more clock signals (differential or single ended) at various frequencies.

It should be noted that while the example shown in FIG. 3 is a dual core processor, various embodiments of the ring oscillator circuit described herein may be implemented in a wide variety of integrated circuits. Such integrated circuits include (but are not limited to) single core processors, multi-core processors having more than two cores, digital signal processors, application specific integrated circuits, analog integrated circuits, mixed-signal integrated circuits, and so forth. In general, various embodiments of the ring oscillator discussed herein are contemplated for use in any implementation of an integrated circuit or other device wherein a differential ring clock signal is required.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An oscillator comprising:
  a first ring oscillator, the first ring oscillator including a first plurality of inverters;
  a first plurality of capacitors, wherein a first terminal of each of the first plurality of capacitors is coupled to an output terminal of a corresponding one of the first plurality of inverters;
  a second ring oscillator, the second ring oscillator including a second plurality of inverters; and
  a second plurality of capacitors, wherein a first terminal of each of the second plurality of capacitors is coupled to an output terminal of a corresponding one of the second plurality of inverters;
  wherein a second terminal of each of the first plurality of capacitors is coupled to an output terminal of a corresponding one of the second plurality of inverters;
  wherein a second terminal of each of the second plurality of capacitors is coupled to an output terminal of a corresponding one of the first plurality of inverters; and
  wherein the oscillator is configured to provide as an output a differential clock signal.

2. The oscillator as recited in claim 1, wherein each of the first plurality of capacitors is integrated into a corresponding one of the first plurality of inverters, and wherein each of the second plurality of capacitors is integrated into a corresponding one of the second plurality of inverters.

3. An oscillator comprising:
  a first ring oscillator, the first ring oscillator including a first plurality of inverters; and
  a second ring oscillator, the second ring oscillator including a second plurality of inverters;
  wherein each one of the inverters of each of the first and second pluralities includes a first output terminal and a dedicated capacitive output terminal separate from the first output terminal of either of the first or second pluralities;
  wherein the dedicated capacitive output terminal of each of the first plurality of inverters is coupled to a unique one of the inputs of the second plurality of inverters with respect to the dedicated capacitive output terminals of the other inverters of the first plurality of inverters; and
  wherein the dedicated capacitive output terminal of each of the second plurality of inverters is coupled to a unique one of the inputs of the first plurality of inverters with respect to the dedicated capacitive output terminals of the other inverters of the second plurality of inverters.

4. The oscillator as recited in claim 3, wherein each inverter of the first and second pluralities of inverters includes:
  a PMOS transistor;
  an NMOS transistor; and
  an input terminal coupled to a gate terminal of each of the PMOS and NMOS transistors;
  wherein the first output terminal is coupled to a drain terminal of each of the PMOS and NMOS transistors.

5. The oscillator as recited in claim 3, wherein each inverter of the first and second pluralities includes a capacitive circuit coupled between a node of the first output terminal and the dedicated capacitive output terminal.

6. The oscillator as recited in claim 5, wherein the capacitive circuit includes a first capacitor coupled between the node of the normal output terminal and the capacitive output terminal and a second capacitor coupled between the node of the normal first output terminal and the dedicated capacitive output terminal.

7. The oscillator as recited in claim 6, wherein the first capacitor is implemented using a PMOS transistor, and wherein the second capacitor is implemented using an NMOS transistor.

8. The oscillator as recited in claim 7, wherein a gate terminal of each of the PMOS and NMOS transistors is coupled to the first output terminal, and wherein the source and drain terminals of each of the PMOS and NMOS transistors are coupled to the dedicated capacitive output terminal.

9. The oscillator as recited in claim 3, wherein the first plurality of inverters are coupled together in a series configuration, wherein the second plurality of inverters are coupled together in a series configuration, wherein a first output of a last one of the first plurality of inverters is coupled to an input of a first one of the first plurality of inverters, and wherein a first output of a last one of the second plurality of inverters is coupled to an input of a first one of the second plurality of inverters.

10. The oscillator as recited in claim 9, wherein the dedicated capacitive output terminal of the first one of the first plurality of inverters is coupled to the input of a third one of the second plurality of inverters, and wherein the dedicated capacitive output of a first one of the second plurality of inverters is coupled to the input of a third one of the first plurality of inverters.

11. The oscillator circuit as recited in claim 3, wherein the oscillator circuit is configured to provide a differential output clock signal including a true clock signal and a complementary clock signal.

12. An integrated circuit comprising:
at least one core unit configured to perform a function of the integrated circuit;
a clock unit configured to provide a clock signal to the at least one core unit, wherein the clock unit is configured to produce the clock signal based on a received reference clock signal, and
an oscillator circuit configured to generate the reference clock signal, wherein the oscillator circuit includes:
a first plurality of dual-output inverters coupled in series; and
a second plurality of dual-output inverters coupled in series;
wherein each one of the inverters of each of the first and second plurality of dual-output inverters includes a first output and a dedicated capacitive output separate from the first output of either of the first or second pluralities;
wherein the first output of a last inverter of the first plurality is coupled to an input of a first inverter of the first plurality;
wherein the first output of a last inverter of the second plurality is coupled to an input of a first inverter of the second plurality;
wherein the dedicated capacitive output of each inverter of the first plurality is coupled to an input of a unique one of the inverters of the second plurality with respect to the dedicated capacitive output of the other inverters of the first plurality; and
wherein the dedicated capacitive output of each inverter of the second plurality is coupled to an input of a unique one of the inverters of the first plurality with respect to the dedicated capacitive output of the other inverters of the first plurality.

13. The integrated circuit as recited in claim 12, wherein each of the first and second pluralities of dual-output inverters includes:
a PMOS transistor;
a NMOS transistor; and
an input terminal coupled to a gate terminal of each of the PMOS and NMOS transistors;
wherein the first output is coupled to a drain terminal of each of the PMOS and first NMOS transistors.

14. The integrated circuit as recited in claim 13, wherein each inverter of the first and second pluralities includes a capacitive circuit coupled between a node of the first output terminal and the dedicated capacitive output terminal.

15. The integrated circuit as recited in claim 14, wherein the capacitive circuit includes a first capacitor coupled between the node of the first output and the dedicated capacitive output and a second capacitor coupled between the node of the first output and the dedicated capacitive output.

16. The integrated circuit as recited in claim 15, wherein the first capacitor is implemented using a PMOS transistor, and wherein the second capacitor is implemented using an NMOS transistor.

17. The oscillator as recited in claim 16, wherein a gate terminal of each of the PMOS and NMOS transistors is coupled to the node of the first output terminal, and wherein the source and drain terminals of each of the PMOS and NMOS transistors are coupled to the dedicated capacitive output.

18. The integrated circuit as recited in claim 12, wherein the first plurality of inverters are coupled together in a series configuration, wherein the second plurality of inverters are coupled together in a series configuration, wherein an output of a last one of the first plurality of inverters is coupled to an input of a first one of the first plurality of inverters, and wherein an output of a last one of the second plurality of inverters is coupled to an input of a first one of the second plurality of inverters.

19. The integrated circuit as recited in claim 18, wherein the dedicated capacitive output of the first one of the first plurality of inverters is coupled to the input of a third one of the second plurality of inverters, and wherein the dedicated capacitive output of a first one of the second plurality of inverters is coupled to the input of a third one of the first plurality of inverters.

20. The integrated circuit as recited in claim 12 wherein the oscillator is configured to provide a differential output clock signal including a true clock signal and a complementary clock signal.

* * * * *